(12) United States Patent
Park et al.

(10) Patent No.: US 6,222,259 B1
(45) Date of Patent: Apr. 24, 2001

(54) STACK PACKAGE AND METHOD OF FABRICATING THE SAME

(75) Inventors: Sang Wook Park; Soon Jin Cho, both of Kyoungki-do (KR)

(73) Assignee: Hyundai Electronics Industries Co., Ltd., Ichon (KR)

( * ) Notice: Subject to any disclaimer, the term of this patent is extended or adjusted under 35 U.S.C. 154(b) by 0 days.

(21) Appl. No.: 09/393,869

(22) Filed: Sep. 10, 1999

(30) Foreign Application Priority Data

Sep. 15, 1998 (KR) .................................................. 98-37931

(51) Int. Cl.[7] ........................... H01L 23/48; H01L 23/52; H01L 29/40; H01L 23/29; H01L 23/06
(52) U.S. Cl. .......................... 257/690; 438/126; 438/109; 257/784; 257/788; 257/686; 257/703; 257/738
(58) Field of Search ................................... 438/109, 126, 438/FOR 367, FOR 368, FOR 378; 257/784, 788, 686, 690, 703, 738

(56) References Cited

U.S. PATENT DOCUMENTS

| | | | |
|---|---|---|---|
| 4,295,183 | 10/1981 | Miersch et al. | 361/403 |
| 4,443,278 | 4/1984 | Zingher | 156/64 |
| 4,814,855 | 3/1989 | Hodgson et al. | 174/52 |
| 5,045,914 | 9/1991 | Casto et al. | 357/70 |
| 5,055,097 | * 10/1991 | Wood . | |
| 5,081,563 | 1/1992 | Feng et al. | 361/414 |
| 5,291,061 | 3/1994 | Ball | 257/686 |
| 5,356,838 | 10/1994 | Kim | 437/226 |
| 5,368,419 | 11/1994 | Imus | 408/67 |
| 5,442,230 | 8/1995 | Chillara et al. | 257/666 |
| 5,511,306 | 4/1996 | Denton et al. | 29/840 |
| 5,569,955 | 10/1996 | Chillara et al. | 257/666 |
| 5,594,275 | 1/1997 | Kwon et al. | 257/686 |
| 5,739,581 | 4/1998 | Chillara et al. | 257/668 |
| 5,744,827 | 4/1998 | Jeong et al. | 257/686 |
| 5,748,452 | 5/1998 | Londa | 351/790 |
| 5,783,464 | * 7/1998 | Burns . | |
| 5,854,507 | 12/1998 | Miremadi et al. | 257/686 |
| 5,870,289 | 2/1999 | Tokuda et al. | 361/779 |
| 5,910,682 | 6/1999 | Song | 257/685 |

FOREIGN PATENT DOCUMENTS 01136665  5/1989  (JP) .

* cited by examiner

Primary Examiner—David E. Graybill
(74) Attorney, Agent, or Firm—Finnegan, Henderson, Farabow, Garrett & Dunner, L.L.P.

(57) ABSTRACT

Disclosed is a stack package and a method of manufacturing the same. The stack package of the present invention comprises a ceramic capsule. A pair of protruding portions are formed at both upper sides of the ceramic capsule. A first semiconductor chip is attached on the upper face of the ceramic capsule and a second semiconductor chip is attached on a lower face of the ceramic capsule. The first and second semiconductor chips are disposed such that their bonding pads are disposed upwardly, more particularly the second semiconductor chip has a size that its bonding pad may be exposed from both sides of the ceramic capsule. It is preferable to attach a heatsink at the lower face of the second semiconductor chip. The first and second semiconductor chips are electrically connected with a metal wire. A midway portion of the metal wire is laid on the protruding portion of the ceramic capsule. The entire resultant is encapsulated with a molding compound while exposing the portion of metal wire laid on the protruding portion and the heatsink. A conductive bump is formed on the exposed portion of the metal wire, and a solder ball is mounted on the conductive bump.

12 Claims, 9 Drawing Sheets

//STACK PACKAGE AND METHOD OF FABRICATING THE SAME

BACKGROUND OF THE INVENTION

1. Field of the Invention

The present invention generally relates to a semiconductor package, and more particularly to the stack package that one package consists at least two semiconductor chips stacked therein.

2. Description of the Related Art

Rapid progress in the memory chip has been presented to increase memory capacity. Currently, 128 M DRAM is mass-produced, and also the mass-production of 256 M DRAM will be available sooner or later.

For increasing memory chip capacity, i.e. high integration, a technology for inserting cells as many as possible into a given area of semiconductor device, is widely known. However, this method requires high technology such as a precise line width and a considerable amount of time for development. Accordingly, a relatively simpler stacking technology to optimize integrity of the semiconductor device has been developed most recently.

The term "stacking" used in semiconductor industry means a technique to double the memory capacity by heaping up at least two semiconductor chips in a vertical direction. According to the stacking technique, a 128 M DRAM device can be constituted by two 64 M DRAM devices for instance, also a 256 M DRAM device can be constituted by two 128 M DRAM devices.

Merely an example of a package fabricated according to the typical stacking technique is illustrated in FIGS. 1 and 2.

As shown in FIG. 1, a lead frame 2 is attached by means of an adhesive 3 to a semiconductor chip 1 in which a bonding pad is disposed on an upper portion of the semiconductor chip 1. An inner lead 21 of the lead frame 2 is connected to the bonding pad with a metal wire 3. The entire resultant is sealed with a molding compound 5 such that both ends of an outer lead 22 of the lead frame 2 is exposed therefrom.

On the package as constituted above, another package having the same constitution as above is stacked. That is to say, the outer lead 22 of the package in the upper position is in contact with a midway portion of the lead frame 2 in the lower position thereby electrically connecting each other.

However, there is a drawback in the general stack package that total thickness of the package is too thick. Further, since an electrical signal should pass the lead frame of the lower package through the outer lead of the upper package, there is another drawback that the electrical signal path is too long. Especially, bad connections are occurred frequently due to bad soldering since leads of both upper and lower packages are joined with each other by soldering.

A conventional stack package to solve foregoing problems is illustrated in FIG. 2.

As shown in the drawing, upper and lower semiconductor chips 1a,1b are opposed with a selected distance. An inner lead 21a of an upper lead frame 2a is attached on the bottom surface of the upper semiconductor chip 1a, thereby electrically connecting to a bonding pad of the upper semiconductor chip 1a with a metal wire 4a. Further, an inner lead 21b of a lower lead frame 2b is attached on the top surface of the lower semiconductor chip 1b thereby electrically connecting to a bonding pad of the lower semiconductor chip 1b with a metal wire 4b.

An outer lead 22a of the upper lead frame 1a is electrically bonded at a midway portion of the lower lead frame 2a by the laser and an outer lead 22a of the lower lead frame 2b is exposed from a molding compound 5a.

However, the stack package as illustrated in FIG. 2 incurs following shortcomings.

Although this type of stack package often shortens the electrical signal path, there may be occurred a signal interference during operation due to too short distance between the respective lead frames.

Furthermore, since the respective lead frames are opposed each other, there is a high probability of inferiority originated from the clearance between the lead frames. Since the respective lead frames are bonded by the laser, therefore an expensive laser equipment is required. Especially, as those lead frames are bonded semi-permanently, it is almost impossible to repair the device afterward. Further, when size of the chip is changed, it is required to manufacture new lead frames accordingly.

In addition to those shortcomings, an effective heat dissipation is not performed during operation since the respective semiconductor chips are positioned inside of the molding compound. That is, since there is no room for a heatsink for heat-dissipating function, the heat dissipation is performed inferiorly.

SUMMARY OF THE INVENTION

Therefore, the present invention is provided to solve the above-mentioned disadvantages and shortcomings.

It is one object of the present invention to provide a stack package capable of shortening signal transmittance path without increasing total thickness and also capable of preventing signal interference to the utmost, and to a method of manufacturing the same.

It is another object of the present invention to prevent inferiority due to the clearance between lead frames by excluding lead frames fundamentally. Also, there may be no need to remanufacture lead frames according to changes in the size of the semiconductor chips and it is also easy to repair afterward.

A stack package as to solve foregoing objects of the present invention comprises a ceramic capsule. A pair of protruding portions are formed at both upper sides of the ceramic capsule. A first semiconductor chip is attached on the upper face of the ceramic capsule and a second semiconductor chip is attached on a lower face of the ceramic capsule. The first and second semiconductor chips are disposed such that their bonding pads are disposed upwardly, more particularly the second semiconductor chip has a size that its bonding pad may be exposed from both sides of the ceramic capsule. It is preferable to attach a heatsink at the lower face of the second semiconductor chip. The respective bonding pads of the first and second semiconductor chips are electrically connected with a metal wire. A midway portion of the metal wire is laid on the protruding portion of the ceramic capsule. The entire resultant is encapsulated with a molding compound while exposing the portion of metal wire laid on the protruding portion and the heatsink. A conductive bump is formed on the exposed portion of the metal wire, and a solder ball is mounted on the conductive bump.

A method of manufacturing the stack package as constituted above is as follows.

A first semiconductor chip is attached on an upper face of a ceramic capsule in which a pair of protruding portions are formed at both upper sides, so that a bonding pad of the first semiconductor chip is positioned upwardly. A second semiconductor chip having enough size which can expose its bonding pad to both sides of the ceramic capsule, is attached on a lower face of the ceramic capsule so that the bonding pad of the second semiconductor chip is positioned upwardly. One end of a metal wire is electrically connected to the bonding pad of the first semiconductor chip and the other end of the metal wire is electrically connected over a protruding portion of the ceramic capsule to the bonding pad of the second semiconductor chip. The entire resultant is encapsulate with a molding compound while exposing the metal wire portion laid on the protruding portion of the ceramic capsule and bottom surface of the second semiconductor chip. A conductive bump is formed on the metal wire portion exposed from the molding compound. Afterward, a solder ball is mounted on the conductive bump.

According to the above construction of the present invention, for those reasons that first and second semiconductor chips are disposed with a ceramic capsule therebetween; the respective bonding pads are connected by metal wires rather than lead frames; and the solder ball is mounted on the metal wire portion exposed from the molding compound, there exists less probability of signal interference and it is easy to repair afterward since metal wires are easy to remove.

DETAILED DESCRIPTION OF THE PREFERRED EMBODIMENTS

Hereinafter, the preferred embodiments of the present invention will be described with reference to the attached drawings.

[First Embodiment]

FIGS. 3 to 10 are successive cross-sectional views showing manufacturing procedures of a stack package according to a first embodiment of the present invention.

Figure 4:
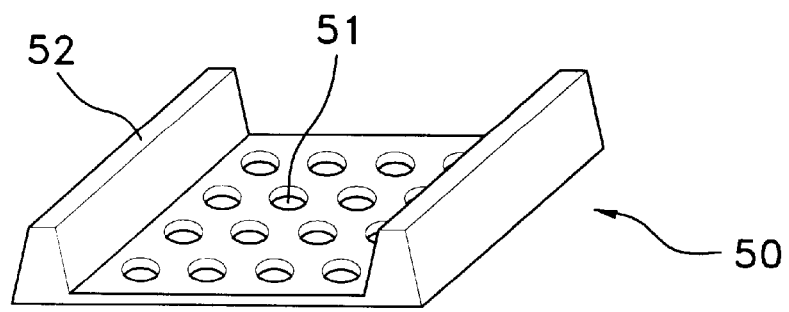

First of all, a ceramic capsule 50 is provided as shown in FIG. 4. A pair of protruding portions are formed at both upper sides of the ceramic capsule 50. A plurality of holes 51 are formed in a horizontal plane between the protruding portions 52 of the ceramic capsule 50.

Figure 1:
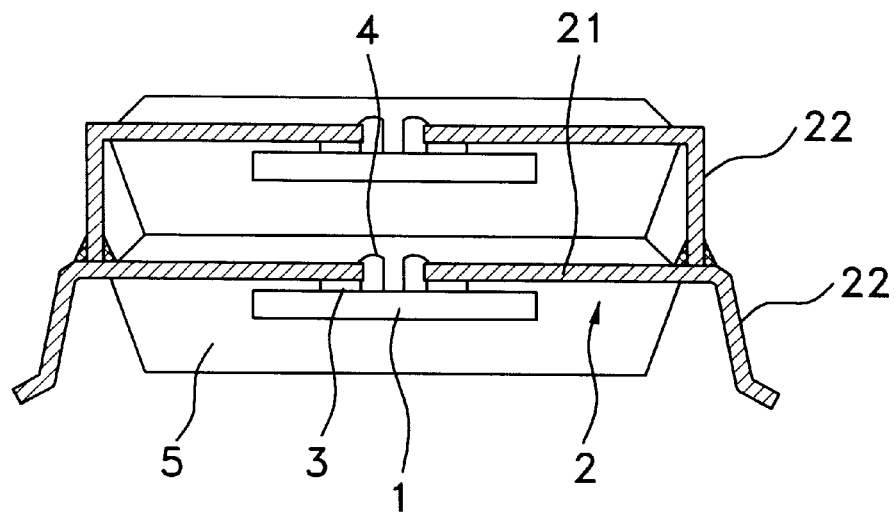
FIGS. 1 and 2 are cross-sectional views showing conventional chip stack packages.
Figure 2:
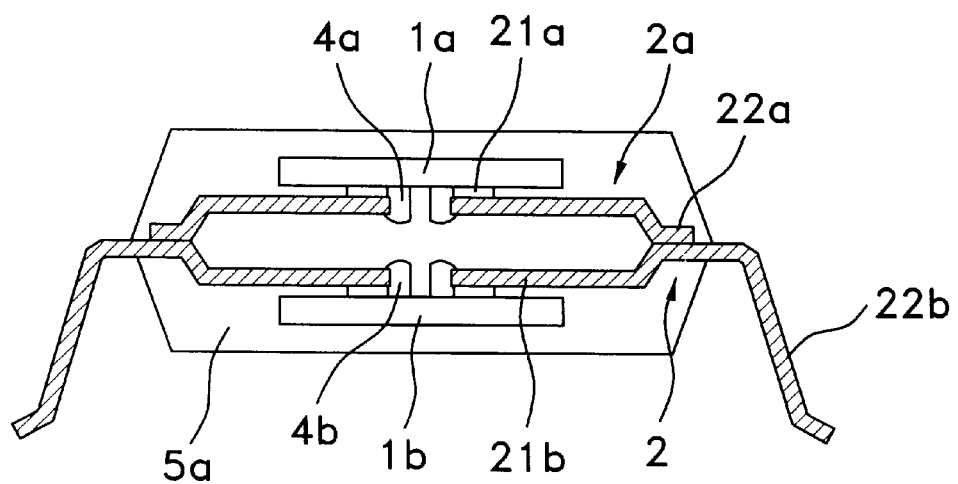
Figure 3:
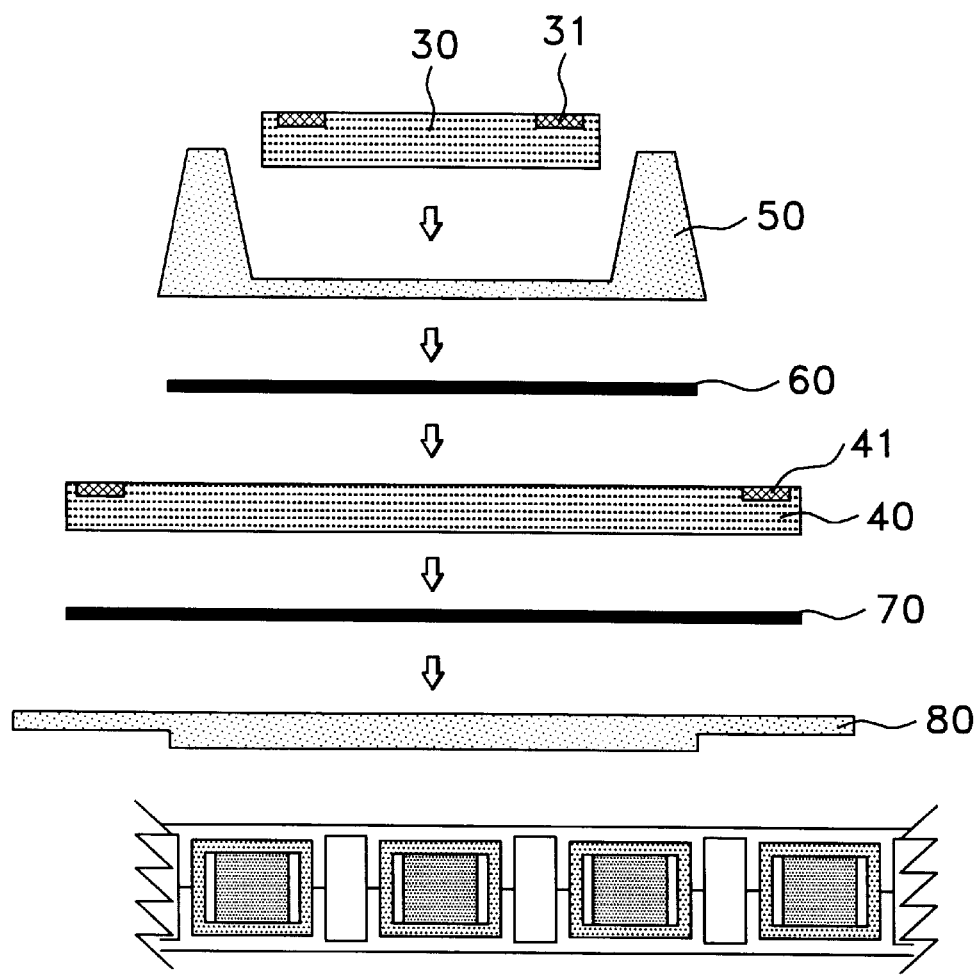
FIGS. 3 to 10 are successive cross-sectional views showing manufacturing procedures of a stack package according to a first embodiment of the present invention.

As shown in FIG. 3, a first semiconductor chip 30 is entered between both protruding portions 52 and installed on the upper face of the ceramic capsule 50 so that its bonding pad 31 is positioned upwardly. A second semiconductor chip 40 enough size which may expose its bonding pad 41 to both sides of the ceramic capsule 50, is attached on the lower face of the ceramic capsule 50 with the medium of an adhesive 60. At this time, as the adhesive 60 is pressed by the second semiconductor chip 40, the adhesive 60 is soaked into the first semiconductor chip 30 and the ceramic capsule 50 via the holes 51 thereby attaching the first semiconductor chip 30 to the upper face of the ceramic capsule 50. Afterward, a heatsink 70 is then attached on a lower face of the second semiconductor chip 40 with another adhesive 70.

Figure 5:
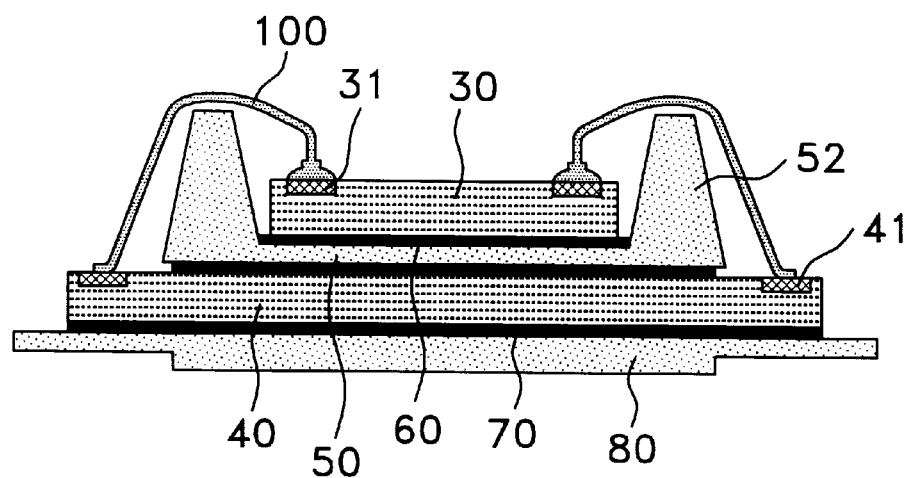

Next, as shown in FIG. 5, the respective bonding pacs 31,41 of the first and second semiconductor chips 30,40 are electrically connected with a metal wire 100. Herein, as the metal wire 100 goes over the protruding portions 52, a midway portion of the metal wire 100 is laid on the protruding portion 52.

Figure 6:
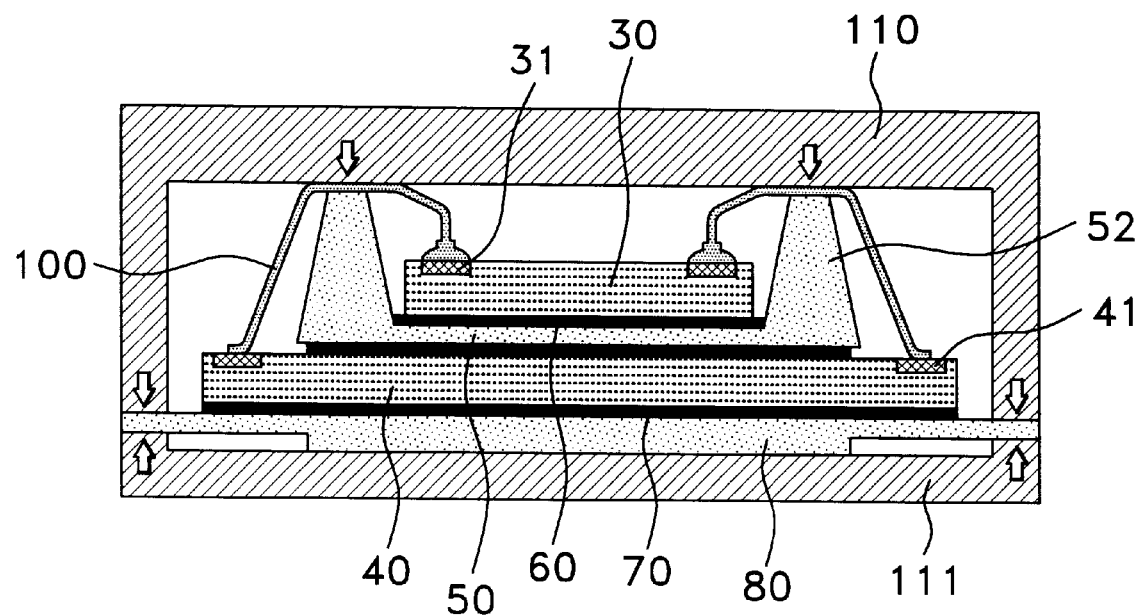

As shown in FIG. 6, the entire resultant is located within a cavity between upper and lower molding dies 110,111, and then a molding compound is flowed into the cavity. At this time, both ends of the heatsink 80 are inserted at interfaces of the upper and lower molding dies 110,111, and the protruding portions 52 are faced with an upper wall of the cavity of the upper molding die 110. The midway portion of the metal wire 100 is pressed by the protruding portion 52 and the upper molding die 110, and the molding compound 120 is not coated between the protruding portion 52 and the upper molding die 110, and accordingly as shown in FIG. 7, only the midway portion of the metal wire 100 and the bottom surface and side faces of the heatsink 80 are exposed from the molding compound 120.

Figure 7:
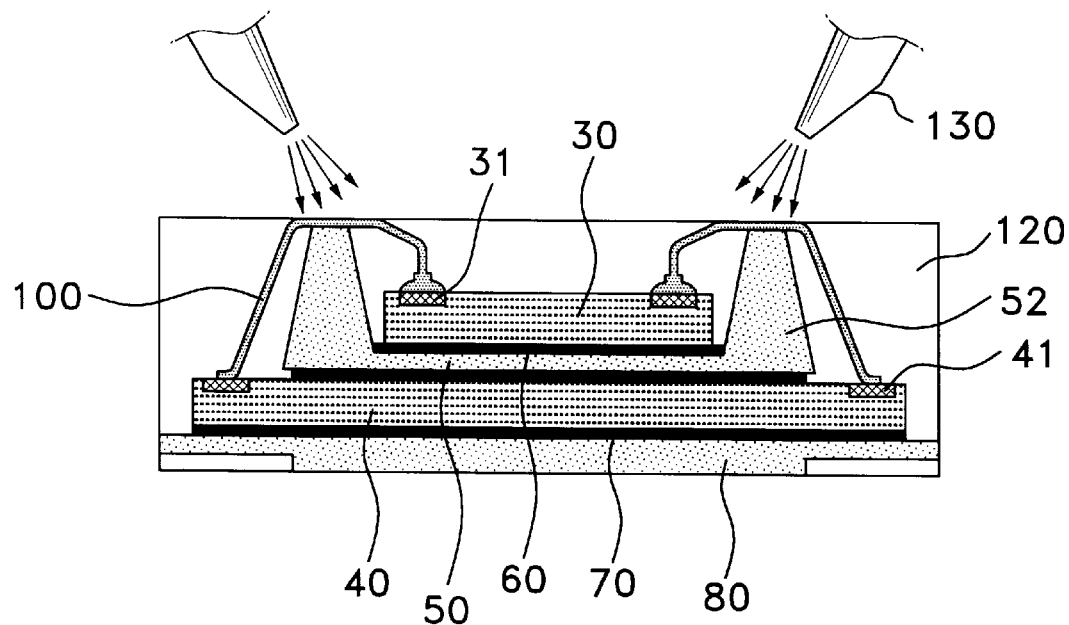

Afterward, to expose the midway portion of the metal wire 100 surely, a polishing compound is injected from a nozzle 130 to an upper face of the molding compound 120 as shown in FIG. 7 thereby removing a selected thickness of the molding compound 120. Instead of the polishing compound, a polishing paper can be used.

Figure 8:
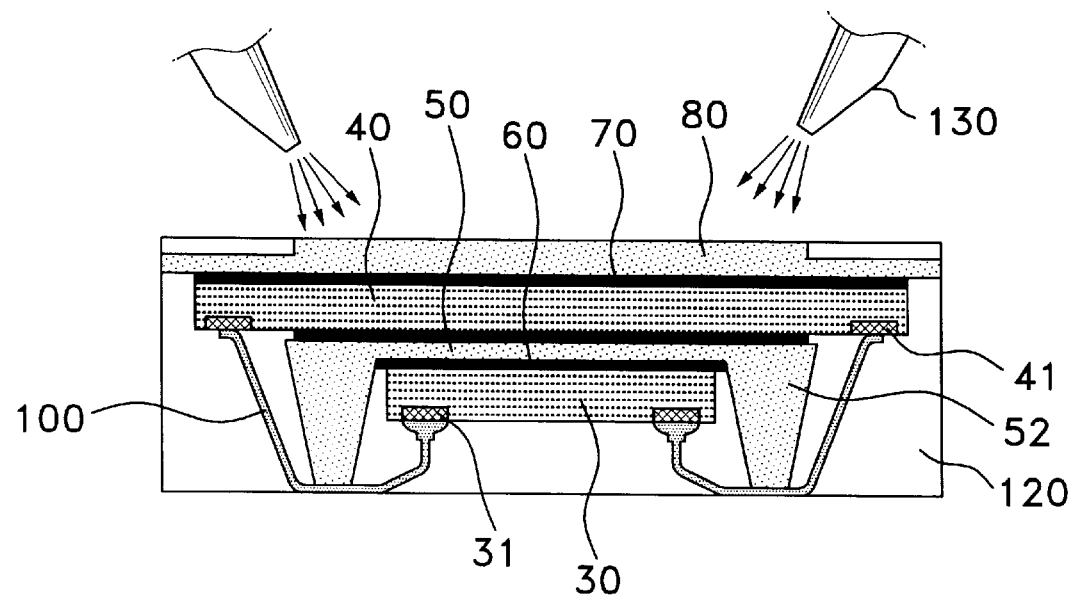

Further, as shown in FIG. 8, to expose the midway portion of the bottom surface of the heatsink 80 from the molding compound 120 surely, the entire structure is reversed and then polished by injecting the polishing compound to the upper surface of the heatsink 80.

Figure 9:
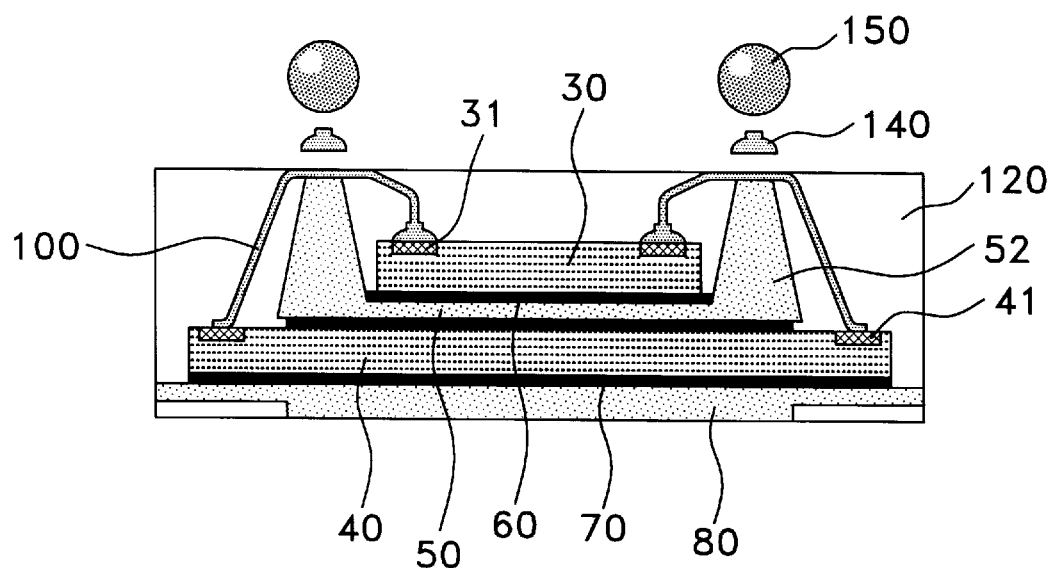
Figure 10:
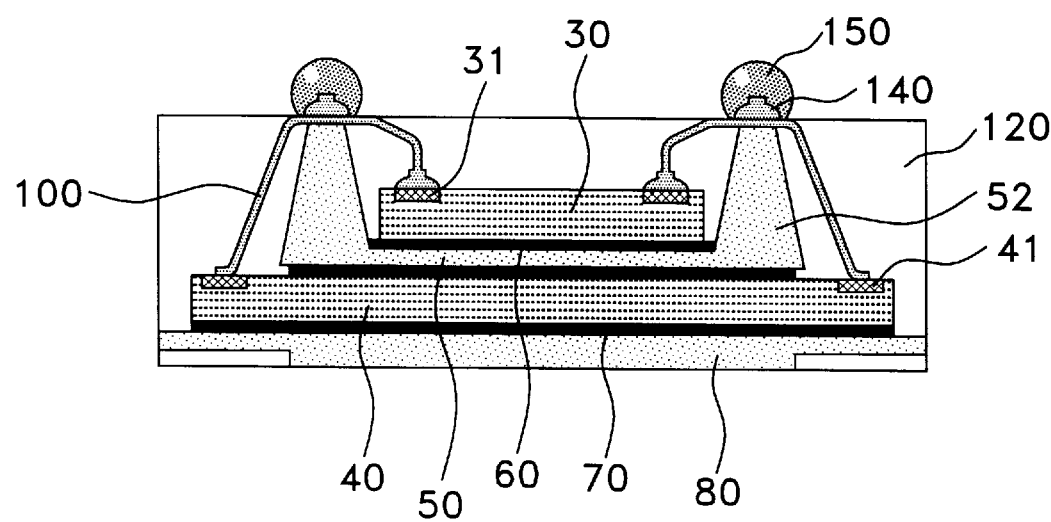

Next, as shown in FIG. 9, a conductive bump 140 is formed on the midway portion of the metal wire 100 exposed from the molding compound 120 and a solder ball 150 is mounted on the conductive bump 140 thereby accomplishing the stack package according to the first embodiment as shown in FIG. 10.

[Second Embodiment]

Figure 11:
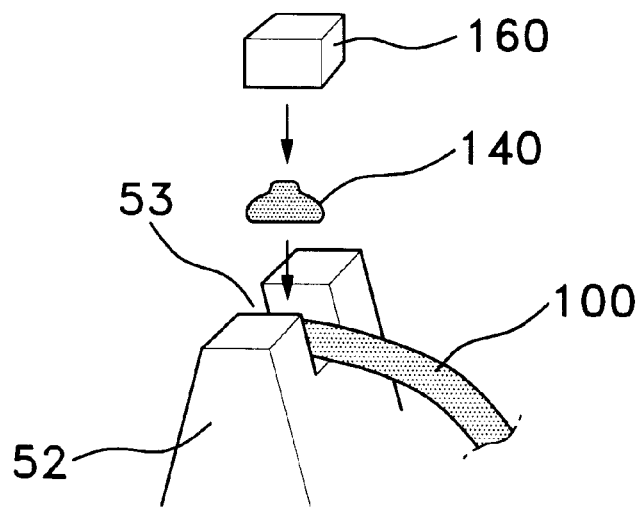
FIGS. 11 to 13 are cross-sectional views showing a stack package according to a second embodiment of the present invention.
Figure 12:
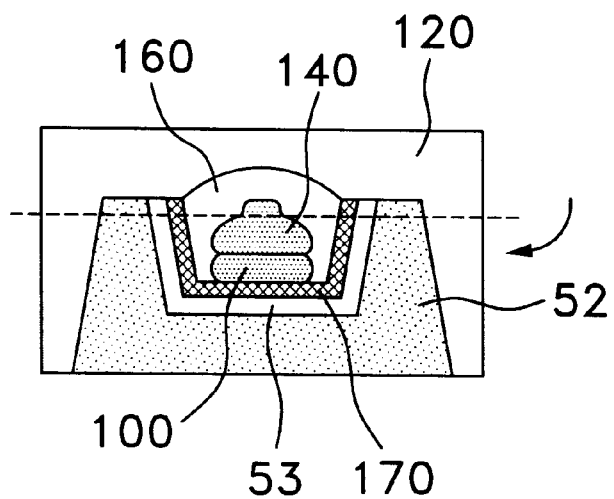
Figure 13:
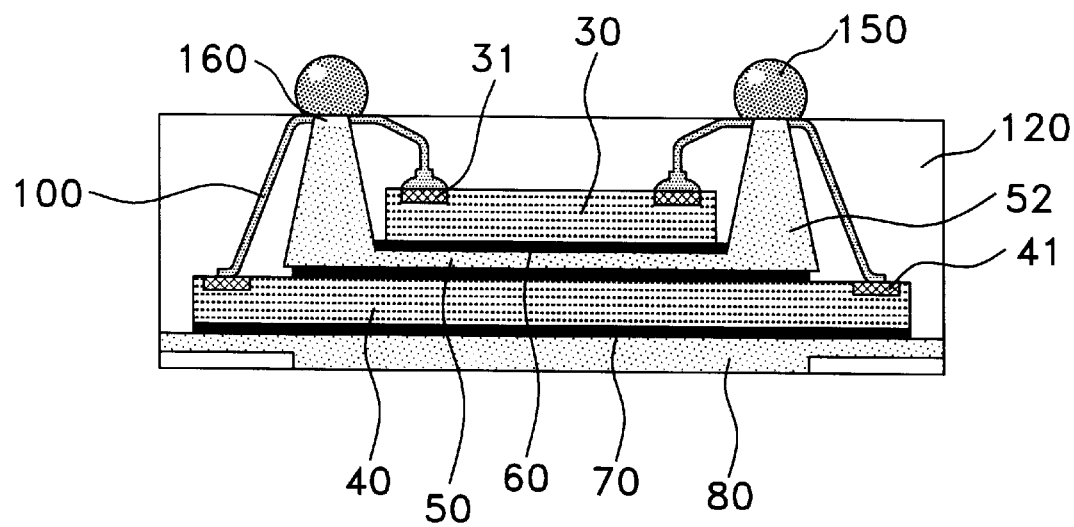

FIGS. 11 to 13 are cross-sectional views showing a stack package according to a second embodiment of the present invention.

In the second embodiment, there is provided a method to intensify adhesion force of the solder ball 150. As shown in FIG. 11, a ball land 53 of a concave shape is formed on the surface of the protruding portion 52 of the ceramic capsule 50, and the metal wire 100 is inserted into the ball land 53. And then, the conductive bump 140 is entered in the ball land 53 thereby contacting to the metal wire 100. Inner space of the ball land 53 is filled with a solder paste 160.

Next, as shown in FIG. 12, the entire resultant is encapsulated with the molding compound 120 such that the solder paste 160 is not exposed. After that, the molding compound 120, the protruding portion 52 and the solder paste 160 are polished along the dotted line shown in FIG. 12 by removing a selected thickness thereby exposing the conductive bump 140 from the molding compound 120. When the solder ball 150 is mounted on the exposed conductive bump 140 as shown in FIG. 13, the adhesion force between the solder ball 150 and the metal wire 100 with the medium of conductive bump 140 is more intensified.

In the mean time, to intensify the adhesion force of the solder ball 150, it is also desirable to form a plating film 170 at an inner wall of the ball land 53 as shown in FIG. 12.

[Third Embodiment]

Figure 14:
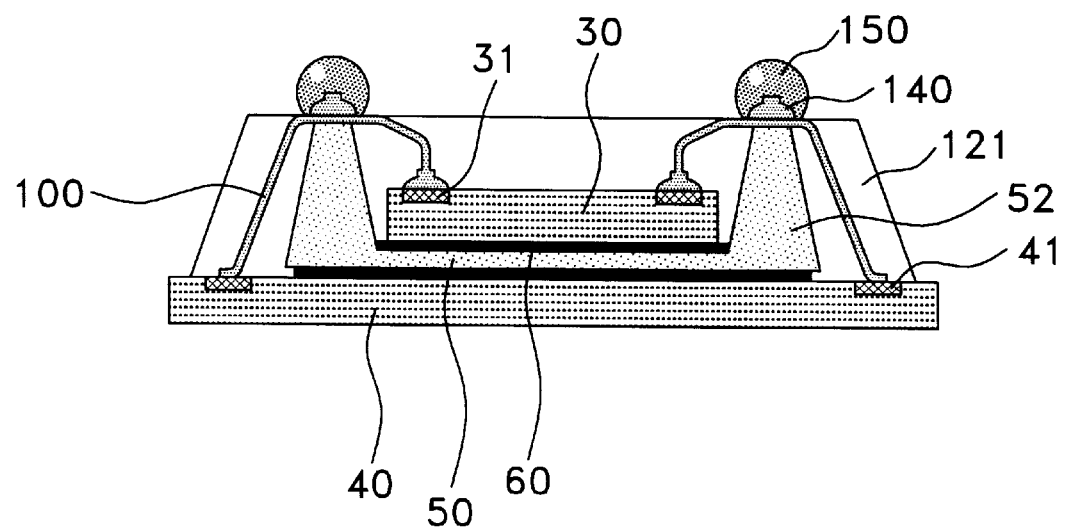
FIG. 14 is a cross-sectional view showing a stack package according to a third embodiment of the present invention.

FIG. 14 is a cross-sectional view showing a stack package according to a third embodiment of the present invention. Other constructions of the stack package are similar to the previous embodiments 1 and 2 except absence of the heatsink. In the present embodiment, a molding compound 121 is coated only on the upper face of the second semiconductor chip 40. In other words, the second semiconductor chip 40 is installed at bottom of a cavity of a lower molding die, and then the molding compound 121 is only coated on the upper face.

[Fourth Embodiment]

Figure 15:
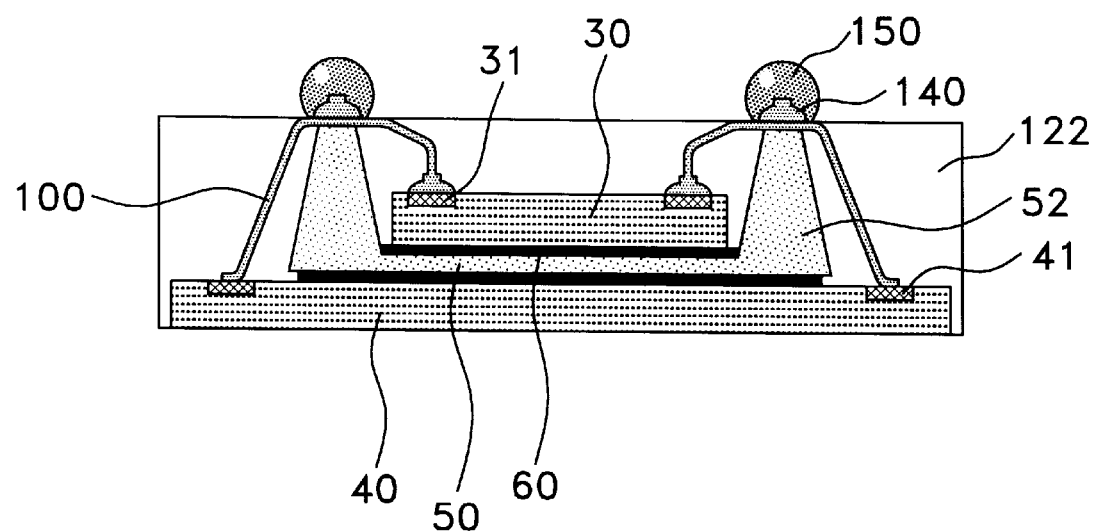
FIG. 15 is a cross-sectional view showing a stack package according to a fourth embodiment of the present invention.

FIG. 15 is a cross-sectional view showing a stack package according to a fourth embodiment of the present invention. The same constitution as in the previous other embodiments is applied to the stack package of the present embodiment, however totally different manufacturing process is performed.

Although not shown in FIG. 15, a dummy plate is attached to a lower face of the second semiconductor chip 40 and the entire resultant is encapsulated with a molding compound 122 under a state that the dummy plate is installed at bottom. surface of a cavity of a molding die. And then, the resultant is polished along the lower face of the second semiconductor chip 40 thereby removing the dummy plate and accomplishing the stack package as shown in FIG. 15.

[Fifth Embodiment]

Figure 16:
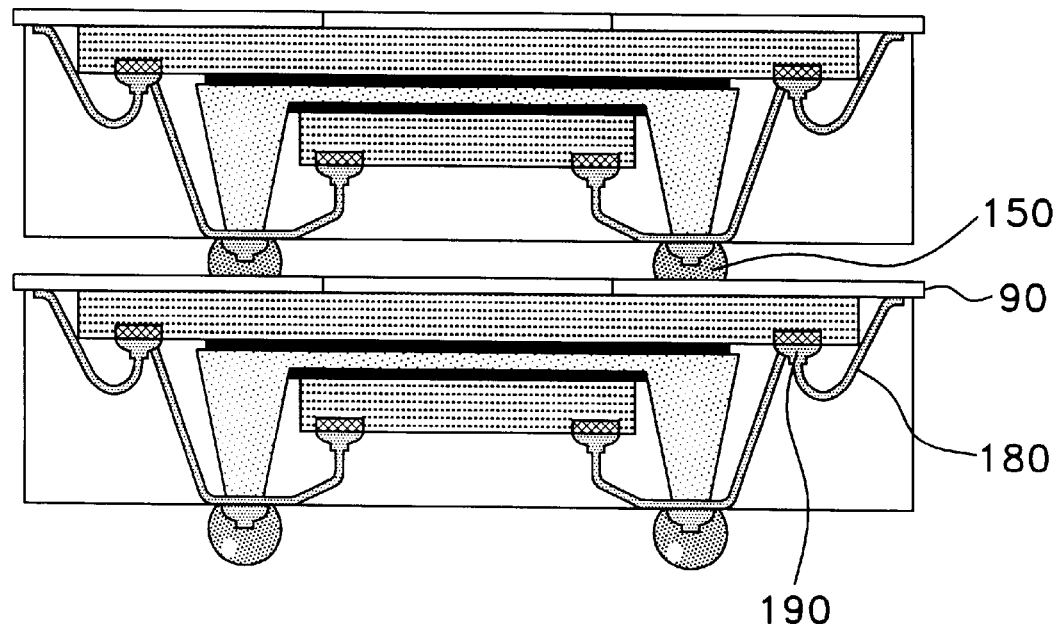
FIG. 16 is a cross-sectional view showing a stack package according to a fifth embodiment of the present invention.
Figure 17:
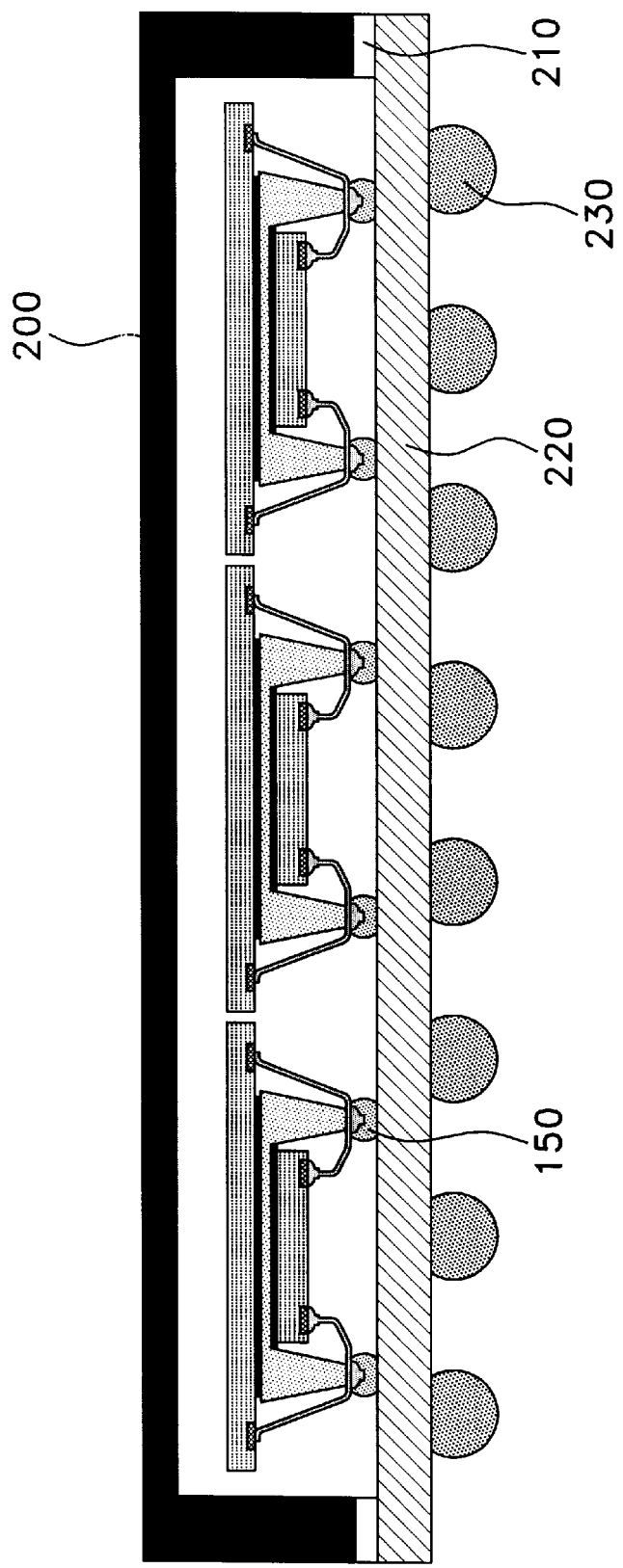
FIG. 17 is a cross-sectional view showing a stack package according to a sixth embodiment of the present invention.

There is provide a method of heaping up another stack package into a stack package. As shown in FIG. 16, a lead frame 90 is attached to an upper face of the second semiconductor chip 40, and then the lead frame 90 and a bonding pad 41 of the second semiconductor chip 40 are connected with a metal wire 180 under a state that a package shown in FIG. 14 or 15 is revered.

Since the lead frame 90 is exposed upwardly, when another solder ball 150 is mounted on the stack package having the same constitution, is contacted with the lead frame 90, then there is formed a stack structure of two stack packages. A plurality of stack packages can be stacked continuously according to the foregoing manner.

[Sixth Embodiment]

The Sixth Embodiment provides a method to exclude the step of molding. There are disposed a plurality of stack packages shown in FIG. 14 or 15 on a substrate 220, and then their respective solder balls 150 are mounded on the substrate 220. This is called as a multi-chip package.

More concretely, a ceramic capsule 200 is put on an upper face of the substrate 220 thereby attaching the ceramic capsule 200 on the substrate 220 with the medium of an adhesive 220. Therefore, the respective stack packages are located within the ceramic capsule 200. There are also mounted a plurality of solder balls 230 in a lower face of the substrate 220.

According to the present invention as described in the foregoing specification, two semiconductor chips are electrically connected each other with a metal wire thereby maintaining the short signal transmittance path and preventing the signal interference.

Further, as bottom surface of the second semiconductor chip is exposed from the molding compound, heat dissipation property is improved, and more particularly it is possible to bond the heatsink to the second semiconductor chip thereby improving the heat dissipation property more and more.

Although preferred embodiments of the stack package are described and illustrated, various other modifications will be apparent to and can be readily made by those skilled in the art without departing from the scope and spirit of the present invention.

What is claimed is:

1. A stack package comprising:
    a ceramic capsule having a pair of protruding portions which are formed at both upper sides of the ceramic capsule;
    a first semiconductor chip attached on an upper face of the ceramic capsule with the medium of an adhesive so that its bonding pad is positioned upwardly;
    a second semiconductor chip having an enough size to expose its bonding pad to both sides of the ceramic capsule and attached on a lower face of the ceramic capsule with the medium of an adhesive so that the bonding pad is positioned upwardly;
    a metal wire, wherein both ends of the metal wire are connected to the respective bonding pads of the first and second semiconductor chips and a midway portion of the metal wire is laid on the protruding portion of the ceramic capsule;
    a molding compound for encapsulating the entire resultant so that the portion of metal wire laid on the protruding portion is exposed;
    a conductive bump formed on the exposed midway portion of the metal wire; and
    a solder ball mounted on the conductive bump.

2. The stack package in claim 1, wherein a ball land of a concave shape is formed on the surface of the protruding portion of the ceramic capsule, a metal wire is inserted into the ball land and a conductive bump is formed inside of the ball land.

3. The stack package in claim 2, wherein a plating film is formed at an inner wall of the ball land and the plating film is contacted with the metal wire.

4. The stack package of claim 1, wherein a bottom surface of the second semiconductor chip is exposed from the molding compound.

5. The stack package of claim 4, wherein a heatsink is attached to the bottom surface of the second semiconductor chip exposed from the molding compound.

6. The stack package of claim 4, wherein a lead frame is attached to the bottom surface of the second semiconductor chip exposed from the molding compound, and the lead frame is electrically connected to the bonding pad of the second semiconductor chip with the medium of a metal wire.

7. The stack package of claim 1, wherein a plurality of holes are formed at a horizontal plane of the ceramic capsule so as to permit a move of the adhesive so that the first and second semiconductor chips are attached on the upper and lower face of the ceramic capsule simultaneously.

8. A method of manufacturing the stack package comprising the steps of:
    attaching a first semiconductor chip on an upper face of a ceramic capsule in which a pair of protruding portions are formed at both upper sides, wherein a bonding pad of the first semiconductor chip is positioned upwardly;
    attaching a second semiconductor chip having enough size which may expose its bonding pad to both sides of the ceramic capsule, on a lower face of the ceramic capsule, wherein the bonding pad of the second semiconductor chip is positioned upwardly;
    electrically connecting one end of a metal wire to the bonding pad of the first semiconductor chip and the other end of the metal wire over the protruding portion of the ceramic capsule to the bonding pad of the second semiconductor chip;
    encapsulating the entire resultant with a molding compound so that a metal wire portion laid on the protruding portion of the ceramic capsule is exposed;

forming a conductive bump on the metal wire portion exposed from the molding compound; and mounting a solder ball on the conductive bump.

9. The method in claim 8, wherein in the step of encapsulating, a bottom surface of the second semiconductor chip is exposed from the molding compound.

10. The method in claim 9, further comprising the step of attaching a heatsink to the bottom surface of the second semiconductor chip exposed from the molding compound.

11. The method in claim 8, before the step of encapsulating, further comprising the steps of:

forming a ball land on a surface of the protruding portion of the ceramic capsule;

inserting a metal wire into the ball land;

forming a conductive bump within the ball land so as to contact with the metal wire; and filling the ball land with a solder paste, and after the step of encapsulating the entire resultant, further comprising the step of exposing the conductive bump by polishing the molding compound and the solder paste.

12. The method in claim 8, wherein a plurality of holes which permit the move of adhesive, are formed in the ceramic capsule so that the first and second semiconductor chips are attached on the ceramic capsule with one type of adhesive simultaneously.

* * * * *